(12) United States Patent
Kakizawa et al.

(10) Patent No.: US 7,061,224 B2
(45) Date of Patent: Jun. 13, 2006

(54) TEST CIRCUIT FOR DELAY LOCK LOOPS

(75) Inventors: Akira Kakizawa, Phoenix, AZ (US); Mark Beiley, Chandler, AZ (US); Mamun Ur Rashid, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/949,583

(22) Filed: Sep. 24, 2004

(65) Prior Publication Data

US 2006/0066291 A1    Mar. 30, 2006

(51) Int. Cl.
*G01R 23/175* (2006.01)
*H03L 7/06* (2006.01)

(52) U.S. Cl. .................................. 324/76.54; 327/158

(58) Field of Classification Search ................ 327/158; 324/76.54
See application file for complete search history.

(56) References Cited

U.S. PATENT DOCUMENTS

| | | | |
|---|---|---|---|
| 6,304,116 B1 * | 10/2001 | Yoon et al. ................. | 327/158 |
| 6,788,594 B1 * | 9/2004 | Ware et al. ................. | 365/194 |
| 6,798,186 B1 * | 9/2004 | Korger et al. ........... | 324/76.54 |
| 6,844,761 B1 * | 1/2005 | Byun et al. ................. | 327/149 |
| 6,850,051 B1 * | 2/2005 | Roberts et al. .......... | 324/76.54 |
| 6,876,186 B1 * | 4/2005 | Gupta .................... | 324/76.54 |
| 2004/0239389 A1 * | 12/2004 | Matsuno ..................... | 327/158 |

* cited by examiner

*Primary Examiner*—Anjan Deb
*Assistant Examiner*—Jeff Natalini
(74) *Attorney, Agent, or Firm*—Schwabe, Williamson & Wyatt, P.C.

(57) ABSTRACT

A method of testing a delay lock loop circuit is provided which comprises receiving an input signal and configuring the delay lock loop to generate a delay lock loop output signal based on the input signal. The method further comprises generating a test output signal from the input signal and delay lock loop output signal indicative of a relationship between a transition on the input signal and a transition on delay lock loop output signal.

11 Claims, 10 Drawing Sheets

TEST CIRCUIT FOR DELAY LOCK LOOPS

FIELD OF THE INVENTION

The present invention relates in general to the field of integrated circuits and, in particular, to the testing of integrated circuits.

BACKGROUND OF INVENTION

High-speed circuits are increasingly demanding that clock distributions have low skew. Various design techniques may be utilized to help achieve a desired clock skew for a given design. One such technique is through the use of delay lock loops.

Delay lock loops delay the outgoing clock signals that are generated from one or more input signals. That is, delay lock loops insert delays between an input clock and output clock to control the time that a clock is to be asserted. These delays can be utilized to maintain clock outputs at precise times taking into account process and temperature variations. In various implementations of a delay lock loop, the value of the delay may be controlled by a phase detector that compares a reference clock to the output clock. As necessary to maintain a desired output clock, the phase detector adjusts the delay driving the output clock.

BRIEF DESCRIPTION OF DRAWINGS

Embodiments of the present invention will be described referencing the accompanying drawings in which like references denote similar elements, and in which.

DETAILED DESCRIPTION OF THE EMBODIMENTS

Various aspects of illustrative embodiments of the invention will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials, and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

The phrase "in one embodiment" is used repeatedly. The phrase generally does not refer to the same embodiment; however, it may. The terms "comprising", "having" and "including" are synonymous, unless the context dictates otherwise.

Delay lock loops provide the ability to handle clock skew in today's high frequency circuit designs. Delay lock loops typically operate by delaying an output clock relative to an input clock by a portion of a clock period. In various embodiments, the amount of the clock delay of the delay lock loop may be controlled from a minimum amount to a maximum amount.

Figure 1:
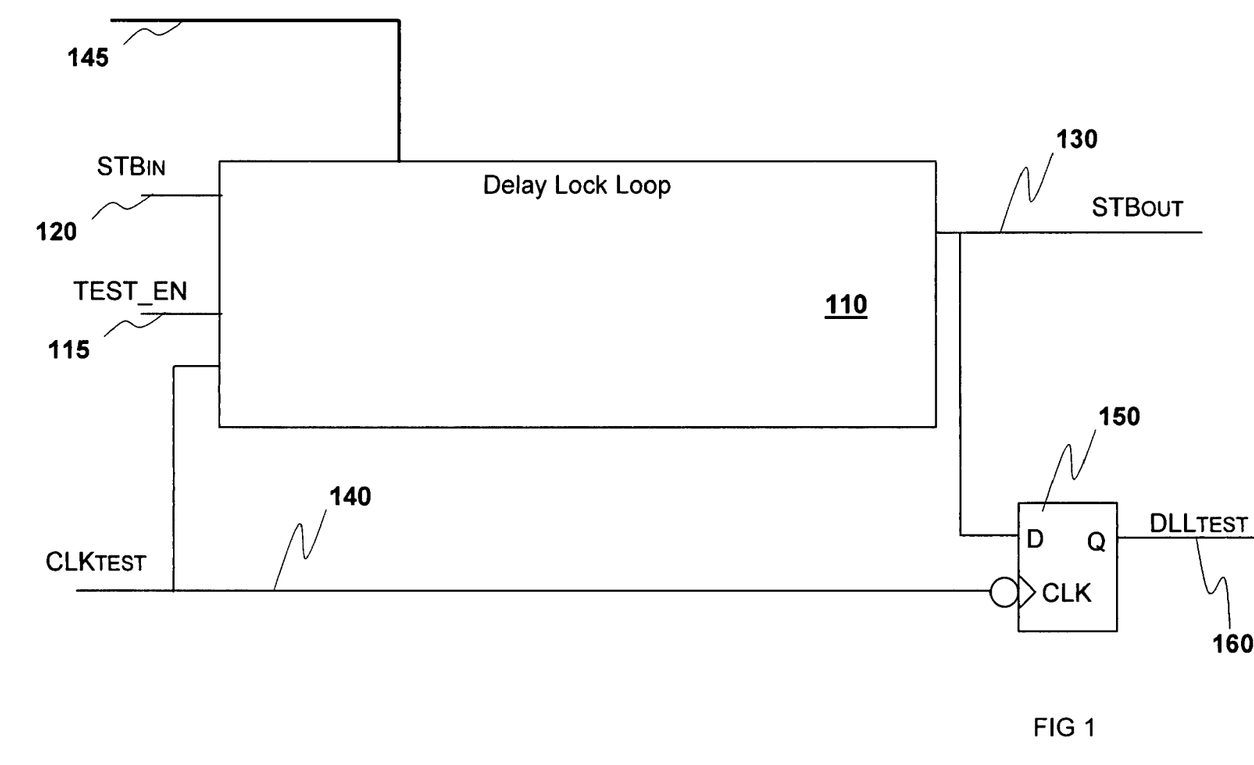
FIG. 1 illustrates a delay lock loop circuit with a testability structure, in accordance with one embodiment.

FIG. 1 illustrates a delay lock loop circuit 110 with a testability structure, in accordance with one embodiment. The delay lock loop (DLL) circuit 110 provides an ability to programmably control a delay from an input strobe 120, $STB_{IN}$, to an output strobe 130, $STB_{OUT}$. In the embodiment illustrated, the output strobe 130 may be programmed to provide a variable delay. For example, in one embodiment, the delay between the input strobe and the output strobe may be programmed to be from 1% of the period to 99% of the period in increments of 1%. Information regarding the desired output delay may be provided to the DLL by configuration signals 145. DLL circuit 110 may be placed in test mode via a test enable signal, TEST_EN 115. When in the test mode, test clock 140, $CLK_{TEST}$, may be utilized in lieu of input strobe 120 to generate output strobe 130. In the test mode, the DLL circuit 110 may be programmed by configuration signals 145 to provide a desired delay for testing purposes.

Figure 2:
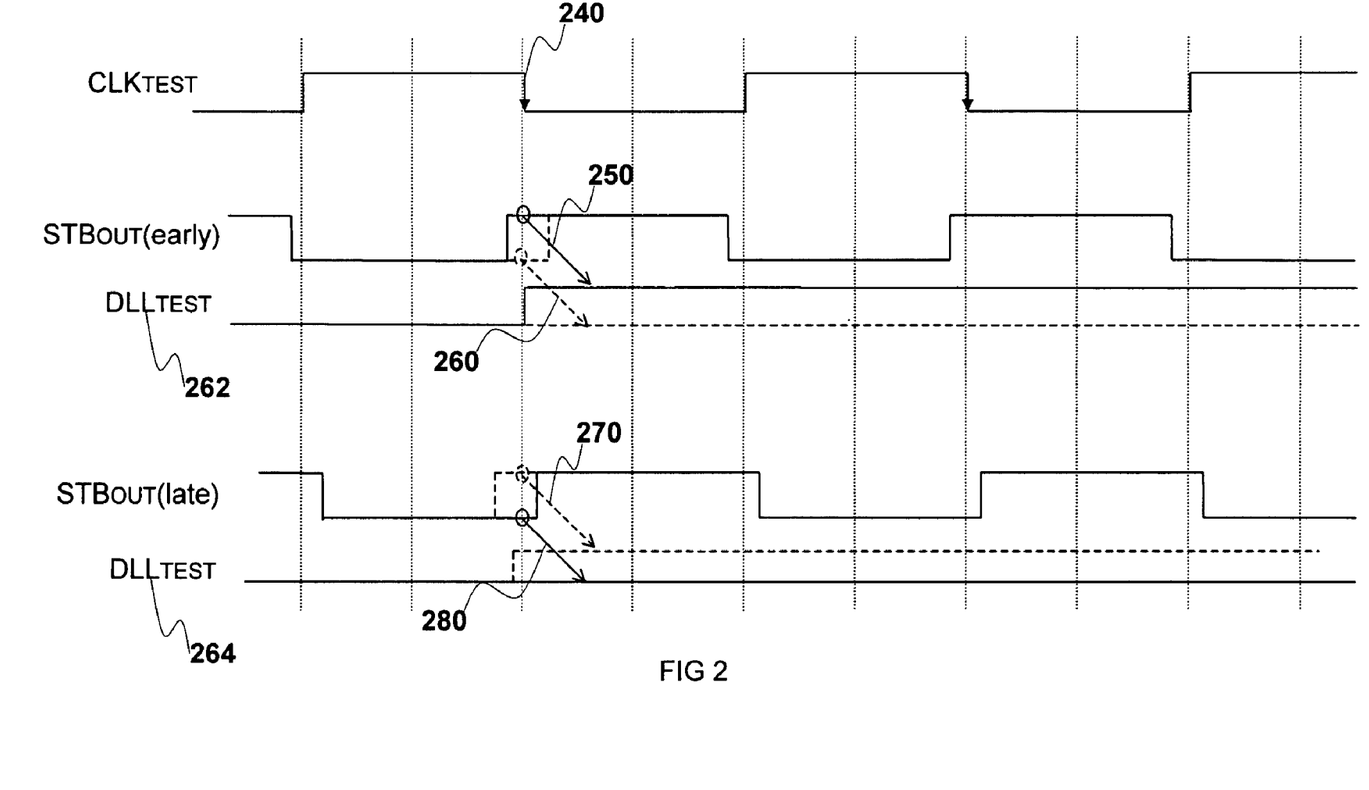
FIG. 2 illustrates timing waveforms for a test mode of the circuit of FIG. 1, in accordance with one embodiment.

FIG. 2 illustrates timing waveforms for a test mode of the circuit of FIG. 1, in accordance with one embodiment. As previously stated, in test mode, the output strobe 130 may be driven by the test clock 140. Note that, in this embodiment, test cell 150 is a falling edge triggered, D-type flip-flop, a type of sequential storage device. Thus, on the falling edge 240 of the test clock 140, test cell 150 will capture the signal on output strobe 130. To provide an indication of the functioning of the DLL circuit, in one test scenario, the output strobe 130 may be programmed to transition just before the falling edge of the test clock, which, as previously indicated, is utilized to generate the output strobe in test mode. In such a case, the expected output on the test output 160 262, $DLL_{TEST}$, may be driven 250 to a logic level reflective of the strobe out 130 signal, e.g. a high logic level. However, if there is an incorrect delay in generation of output strobe 130 by the DLL circuit 110 the transition on the output strobe 130 may not occur until after the falling edge of the test clock 140. Such a delay may occur, for example, if the DLL circuit has manufacturing defects such that the delay from the test clock 140 to the output strobe 130 is longer than expected. In this case, the transition will not be captured by the test cell 150 and the test output 160 262 will remain low 260. The value of the test output 160 262 may be reported elsewhere and utilized by down stream logic or ported off the chip to provide information of a failure.

Similarly, the DLL circuit 110 may be programmed to provide a transition on the output strobe 130 at a time just after the falling edge transition 240 on the test clock 140. In this case, the expected output on the test output 160 264 is that it will be driven to a logic low level 280. If the output strobe 130 does transition 270 prior to the falling edge 240 of the test clock 140, this may provide an indicia that the DLL circuit 130 may not be operating correctly. Again, this may be reported elsewhere for analysis.

Figure 3:
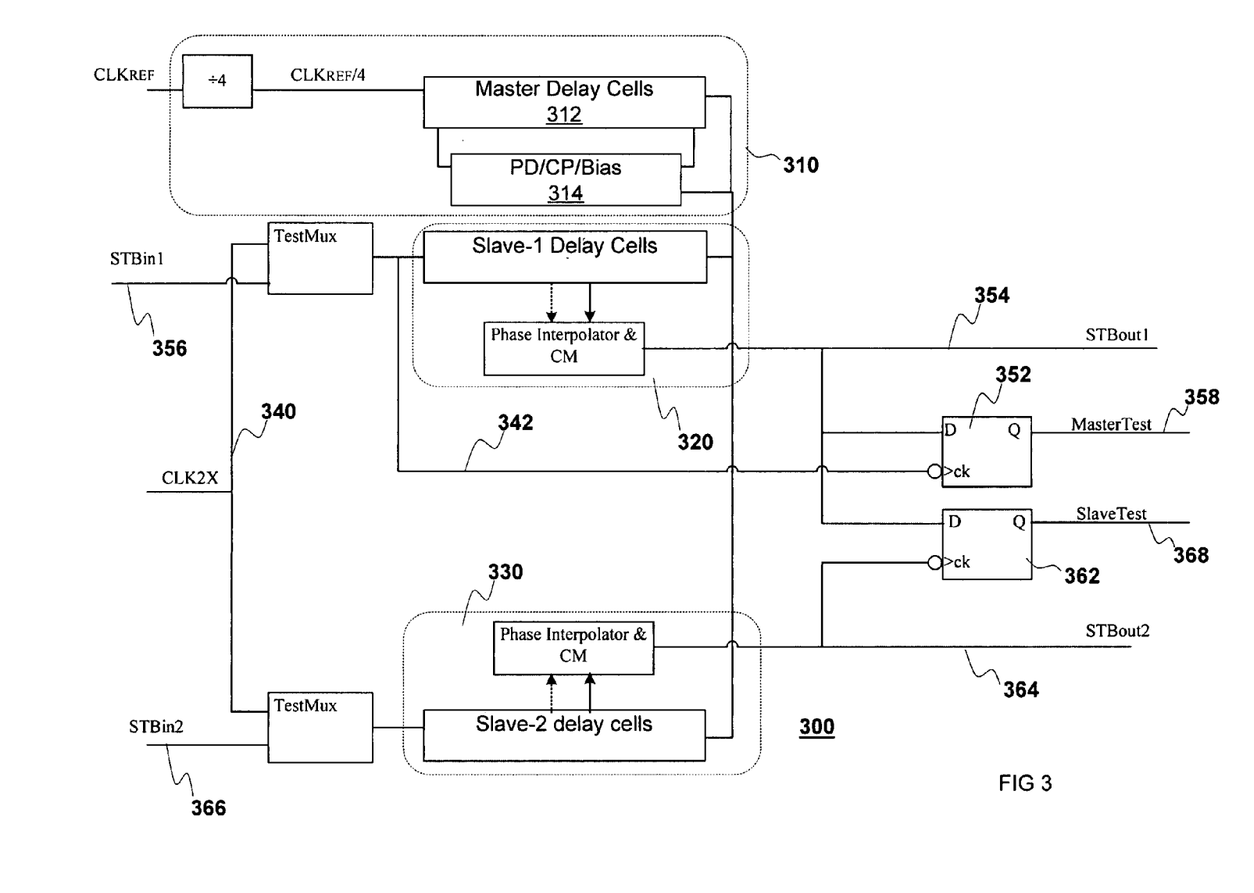
FIG. 3 illustrates a DLL circuit comprising a master element and two slave elements including testability logic, in accordance with one embodiment.

FIG. 3 illustrates a DLL circuit 300 comprising a master element 310 and two slave elements 320 330 including testability logic, in accordance with one embodiment. In this embodiment, two test cells 352 362 may be utilized to provide indicia of potential erroneous operation of the DLL circuit 300. A first test cell 352 may be utilized to provide for a master delay line 312 and bias 314 circuitry test. In the embodiment illustrated, an input multiplexor may be utilized to choose the test clock 340, CLK2X, instead of a first input strobe 356, STBin1, in the generation of a first output strobe 354, STBout1. Thus, in test mode, test clock 342 is utilized in the generation of the master test output 358, MasterTest. There may be tests performed during a test mode to help identify potential problems with the master delay line 312 and bias 314 circuitry.

Figure 4:
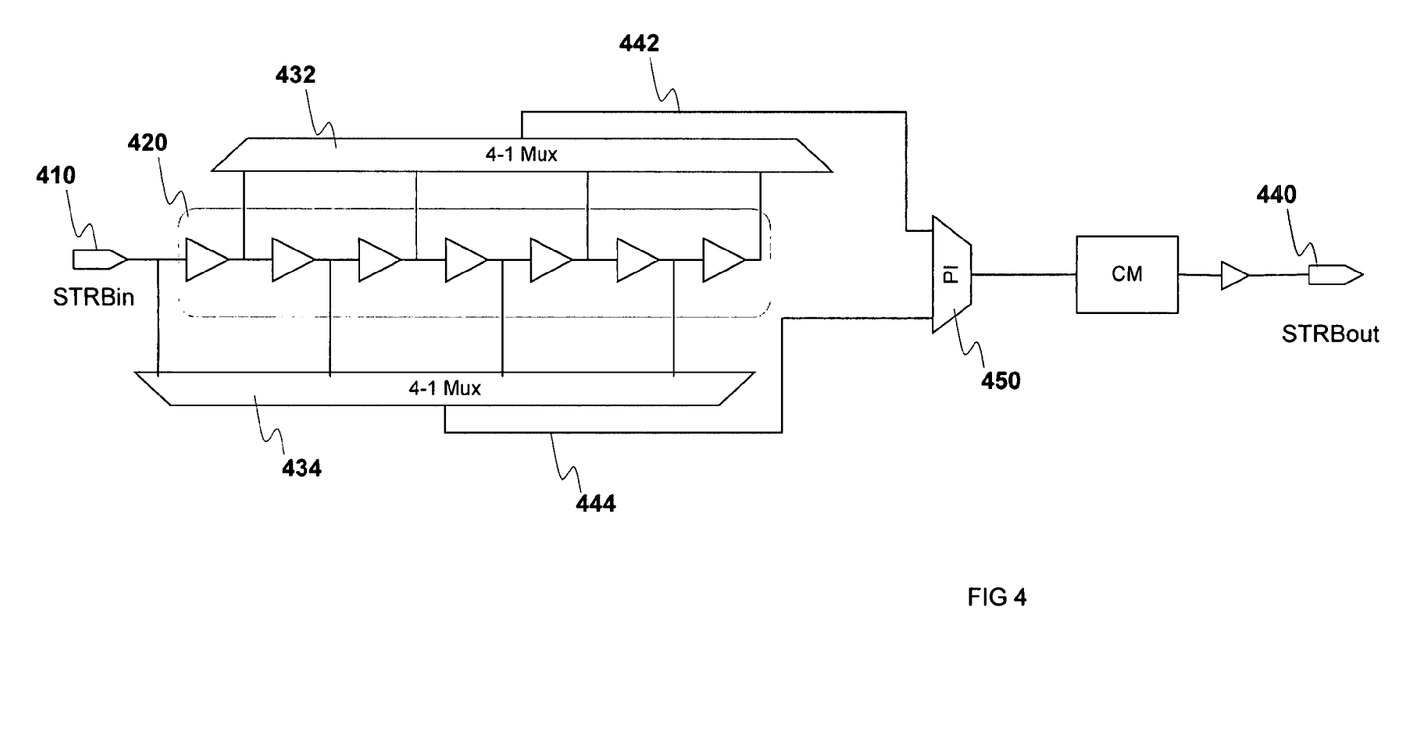
FIG. 4 illustrates a slave element in accordance with one embodiment.

FIG. 4 illustrates a slave element 320 in accordance with one embodiment. The STRBin 410 may be driven by the test clock 342. The slave element 320 may comprise delay cell chain 420 and multiplexers 432 434. The multiplexers 432 434 may be utilized to generate two signals 442 444 delayed relative to one another by tapping the signals at different points in the delay cell chain. An output strobe signal 440 may be generated, in part, by a phase interpolator 450. The output timing of the output strobe signal 440 depends, at least in part, upon which two signals 442 444 are utilized to generate the output strobe signal 440.

Figure 5:
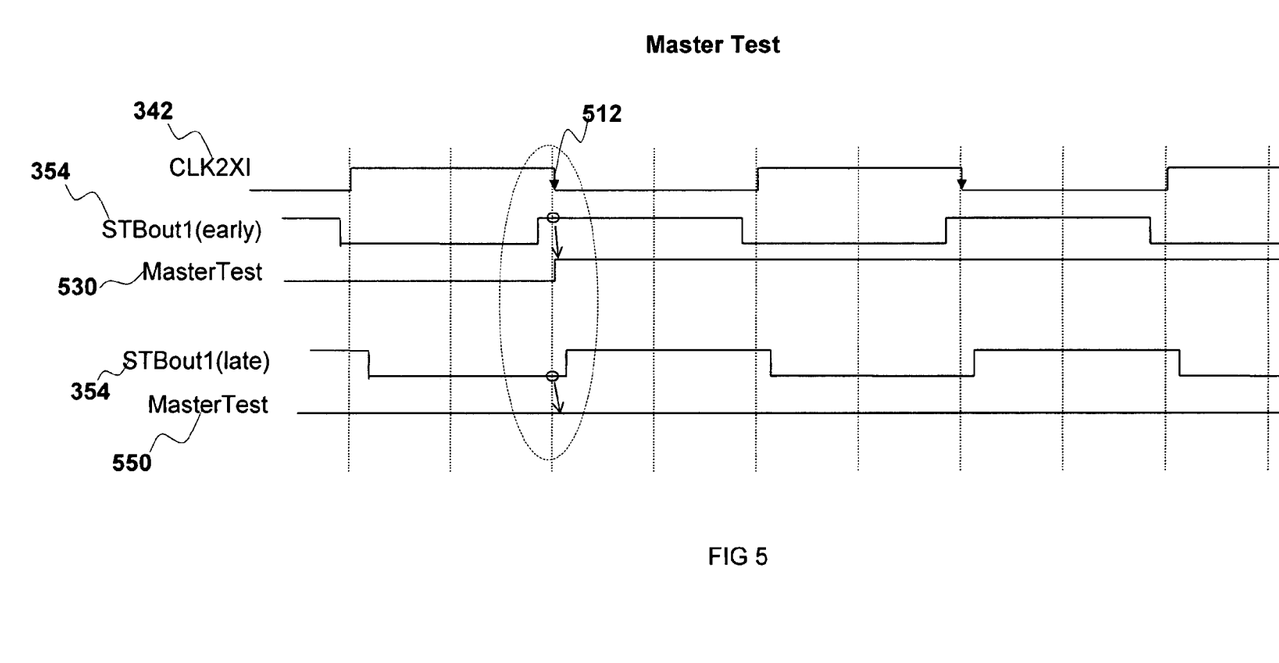
FIG. 5 illustrates timing waveforms of two test utilized to provide testing of the master delay line and bias circuitry, in accordance with one embodiment of such tests.

FIG. 5 illustrates timing waveforms of two test utilized to provide testing of the master delay line 312 and bias 314 circuitry, in accordance with one embodiment of such tests. In one test, master delay line 312 and bias 314 circuitry may be programmed such that the first output strobe 354 may be delayed from the test clock 342 for an amount just before a falling edge transition on the test clock 342. This test may be utilized to determine if there is an error in the generation of the first output strobe 354 that would manifest itself in a delay causing the transition on the output strobe 354 to be pushed passed the falling edge 512 of the test clock 342. The test result indication appears on MasterTest, 530. In a second test, the master delay line 312 and bias 314 circuitry may be programmed such that the first output strobe 354 may be delayed from the test clock 342 for an amount just after the falling edge transition on the test clock 342. In this case, if the output strobe 354 changes prior to the falling edge transition on the test clock 342, this may be an indication of erroneous timing function of the master delay line 312 and/or bias 314 circuitry. Again, the test result indication appears on MasterTest, 550.

In various embodiments, different delays may be utilized to perform varying tests. In one embodiment, a DLL circuit may be a programmable DLL circuit. For example, a DLL circuit with two strobe outputs may support a programmable delay of one or both of the first output strobe 354 and the second output strobe 364. This programmable delay may be between a minimum delay and a maximum delay relative to the test clock 342. In various embodiments, the first output strobe 354 and the second output strobe 364 may be programmed with a single delay or with separate delays.

Figure 6:
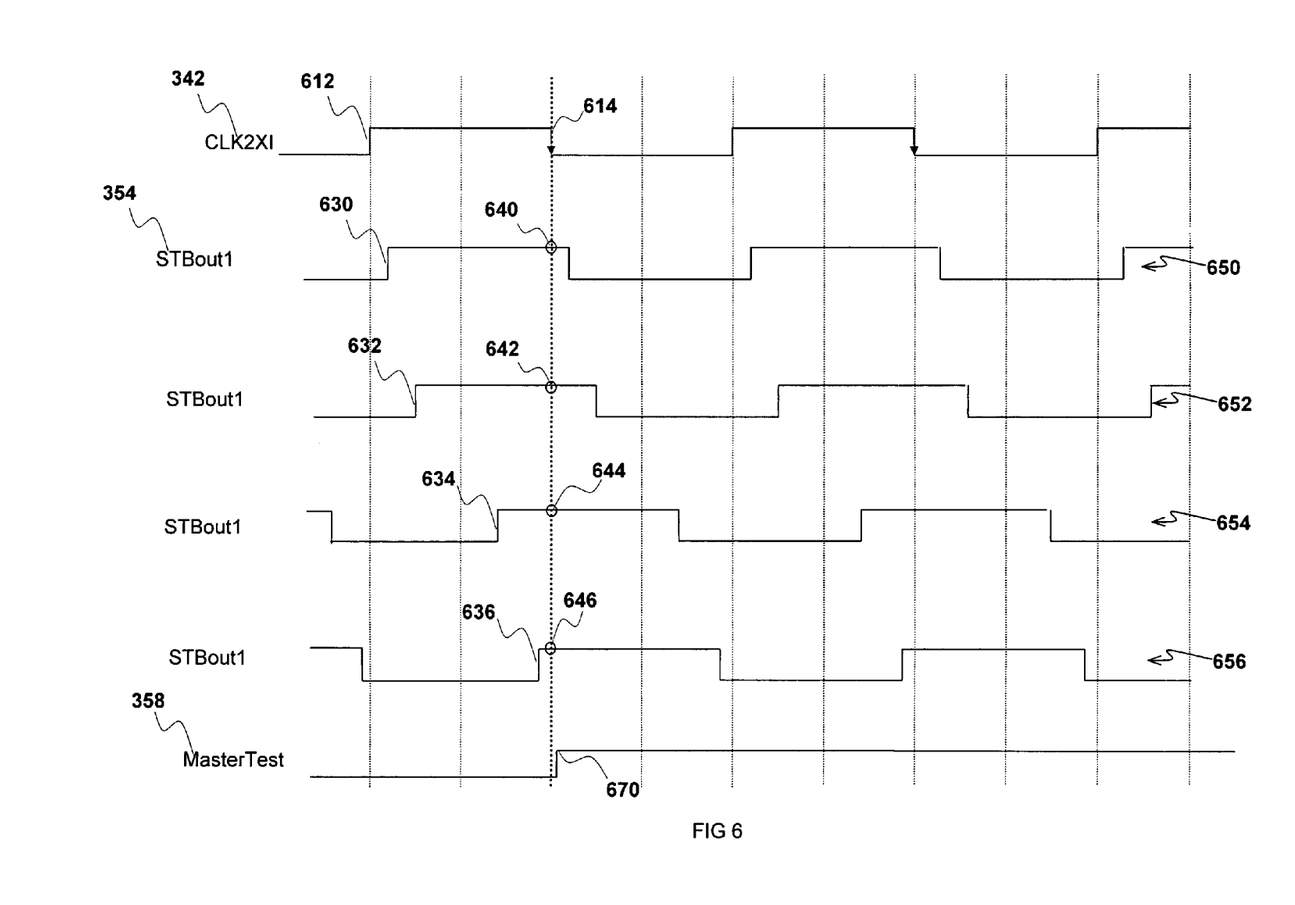
FIG. 6 illustrates waveforms for different programmed delays of first strobe output, in accordance with one embodiment.

FIG. 6 illustrates waveforms for different programmed delays of first strobe output 354, in accordance with one embodiment. A test clock 342 is utilized to generate the first output strobe 354. Expected waveforms 650–656 of the first output strobe 354 are shown for various delays that may be programmed into the DLL circuit. In one instance, a waveform 650 corresponding to a minimum delay from the test clock rising edge 612 to the expected first output strobe rising edge 630 is shown. At the capture time for a test cell, the first output strobe 354 has an expected high logic level value 640 reflected on the MasterTest signal 358 as a rising edge 670. If the actual value on the MasterTest signal 358 differs from the expected value, an failure may be flagged. The first output strobe 354 may be programmed for other delays from a minimum delay 630 to a delay just before 636 the falling edge 614 of the test clock 342. In each case, the expected output on the MasterTest signal 358 is a high logic level corresponding to the high logic levels 640–646 of the expected values on the first output strobe 354. By using multiple tests, it may be possible to gain additional information regarding failures in the DLL circuit. For example, it may be that tests with programmed rising edges of 630–632 pass while tests with programmed rising edges of 634–636 fail. That is, MasterTest is at a high logic value for expected strobes 630–632 and at a low logic level for expected strobes 634–636. This provision of additional information regarding the failure of the DLL may provide indirect evidence of the failure mechanism in the DLL.

Figure 7:
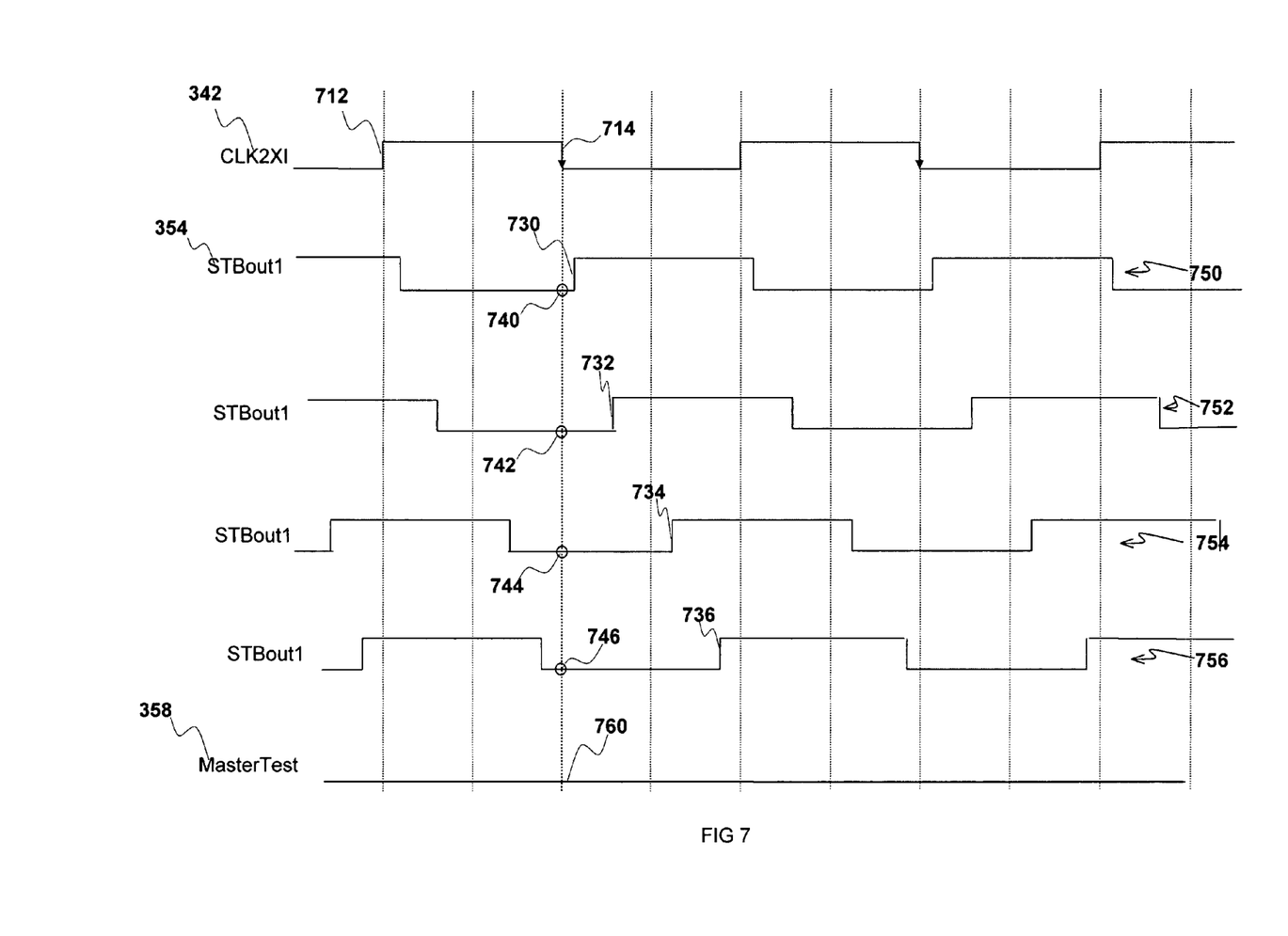
FIG. 7 illustrates additional timing diagrams for programmed delays in a DLL circuit, in accordance with one embodiment.

FIG. 7 illustrates additional timing diagrams for programmed delays in a DLL circuit, in accordance with one embodiment. A test may be performed on delays programmed in a DLL circuit to result in MasterTest 358 maintaining a low logic level 760 after the falling edge 714 of the test clock 342. Expected waveforms 750–756 of the first output strobe 354 are shown for various delays that may be programmed in the DLL circuit. In one instance, a waveform corresponding to the first output strobe 354 with a rising edge 730 just after the falling edge 714 of the test clock 342 is illustrated. In such a case, the expected value on the MasterTest signal 358 is a low logic level 760. Other rising edge times corresponding to programmed delays are also illustrated 732–736. In each of these cases, the expected value on the first output strobe 354 corresponds to a low logic level 742–746. Again, erroneous output values on MasterTest 358 for various programmed delays in the DLL may provide indirect information as to the cause of erroneous functioning of the DLL.

Referring again to FIG. 3, a second test cell 362 may be utilized to provide for a slave delay line test. In one embodiment, the first output strobe 354 and a second output strobe 364 may be programmed for different delays. Note that the delay in signal paths through the first slave delay line 320 and the second slave delay line 330 are designed to be the same. Thus, by programming the two output strobes 354 364 with two different delays, the relationship between the two delays may be deterministic.

Figure 8:
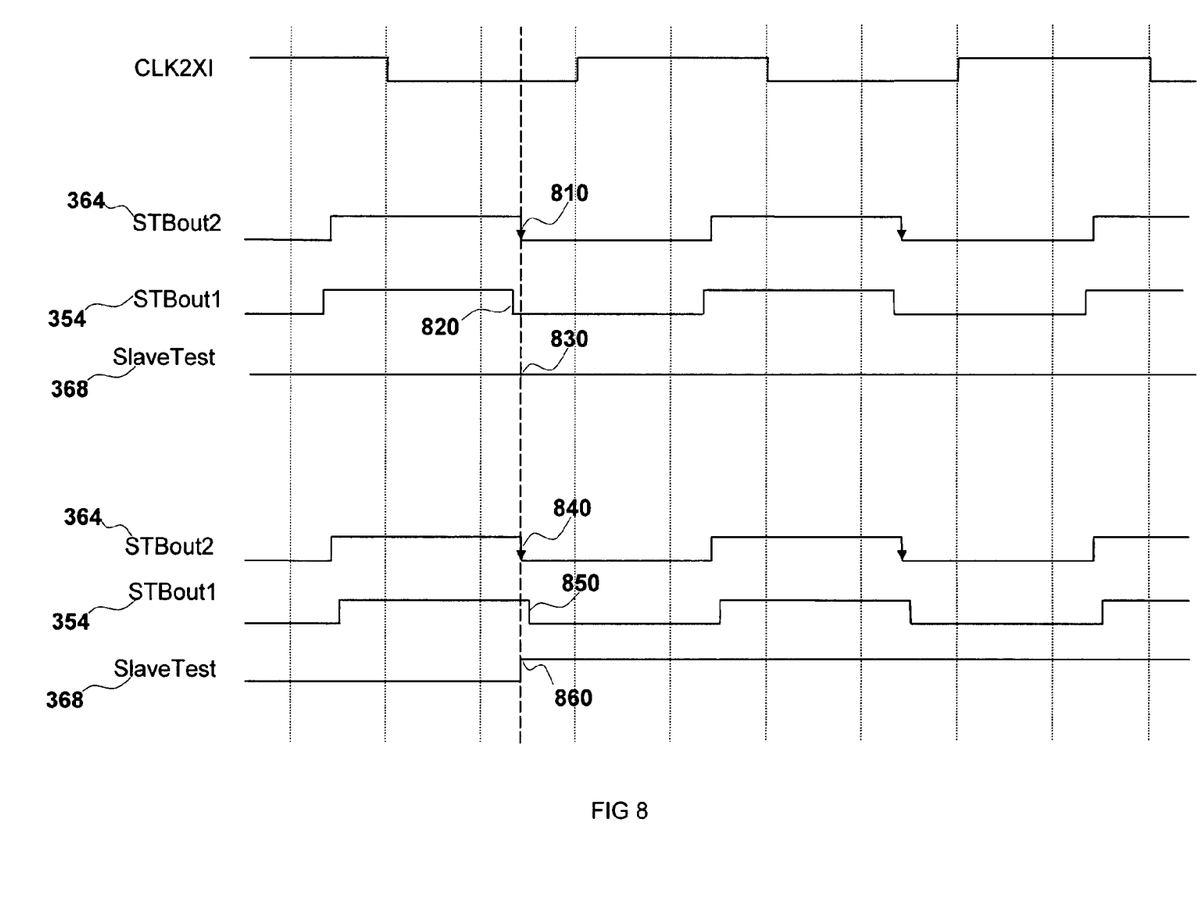
FIG. 8 illustrates timing diagrams for expected values in two configurations of the DLL circuit of FIG. 3, in accordance with one embodiment.

FIG. 8 illustrates timing diagrams for expected values in two configurations of the DLL circuit 300 of FIG. 3, in accordance with one embodiment. The DLL circuit 300 may be programmed such that the first output strobe 354, STBout1, is expected to fall 820 just before a falling edge 810 on the second output strobe 364, STBout2. In this case, a low logic value 830 is expected on SlaveTest 368. Similarly, the DLL circuit 300 may be programmed such that the first output strobe 354 is expected to fall 850 just after a falling edge 840 on the second output strobe 364. In this case, a high logic level 860 is expected on SlaveTest 368.

As previously discussed, testing of portions of a DLL circuit may be performed by monitoring an input strobe and an output strobe relative to each other. In addition, the value of an output strobe may be programmably modified relative to an input strobe to test various ranges of the delay between the input strobe and the output strobe. The same type of testing may occur between the two output strobes as described above to test additional portions of the DLL circuit. That is, for a particular programmed delay on one output strobe, the second output strobe can be varied to determine the effect this variation has on a test output. This may allow for testing of, among other things, the multiplexer circuitry of the slave cells. Thus, as with the test described previously in connection with FIGS. 6 and 7, multiple tests may be performed with varying delays between expected falling edges of a first output strobe and a second output strobe.

Figure 9:
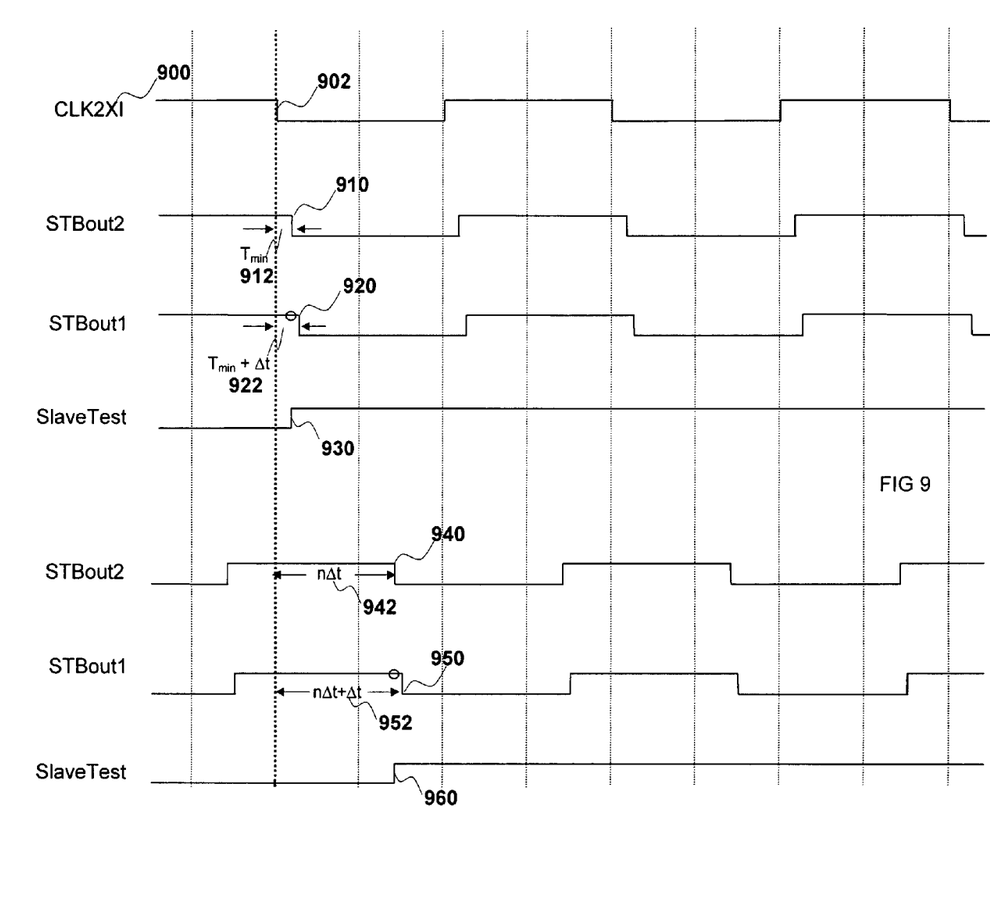
FIG. 9 illustrates timing diagrams for several tests utilizing the first output strobe and the second output strobe, in accordance with one embodiment.

Another form of testing may be to test the relative nature of the two output strobes as they both vary. FIG. 9 illustrates timing diagrams for several tests utilizing the first output strobe and the second output strobe, in accordance with one embodiment. A DLL circuit may be capable of programming output delays in resolutions of at least a value $\Delta t$ with a minimum output delay of $T_{min}$ from an input clock 900. The DLL circuit may be capable of programming output delays up to a maximum of $T_{max}$. In one test, as illustrated, the output delay for a falling transition 910 on a second output strobe from an input clock falling edge 902 may be $T_{min}$ 912. The delay for a falling transition on a first output strobe 920 from the input clock 902 may be $T_{min}+\Delta t$ 922. For this test, an expected output on SlaveTest is a high logic level. Also illustrated in FIG. 8 are timing diagrams for a test during a separate portion of the input clock 900. The second output strobe is programmed to have a falling edge transition at a time $n\Delta t$ 942. The first output strobe is programmed to have a falling edge transition at a time, $\Delta t$ 952, after that (e.g. $n\Delta t+\Delta t$ ). Again, for this test, an expected output on SlaveTest is a high logic level. Thus, it is possible to test the relationship between the two output strobes at different delays allowing for a test of the DLL circuit across delay ranges. For example, in the embodiment illustrated, a high logic level may be expected on the SlaveTest output for programmed values where the delay of the first output strobe may change from $T_{min}+\Delta t$ to $T_{max}$ and the second output strobe may change from $T_{min}$ to $T_{max}-\Delta t$. Similar tests can be performed wherein a low logic level may be expected. For example, a low logic level may be expected on the SlaveTest output for programmed values where the delay of the first output strobe may change from $T_{min}$ to $T_{max}-\Delta t$ and the second output strobe may change from $T_{min}+\Delta t$ to $T_{max}$.

Figure 10:
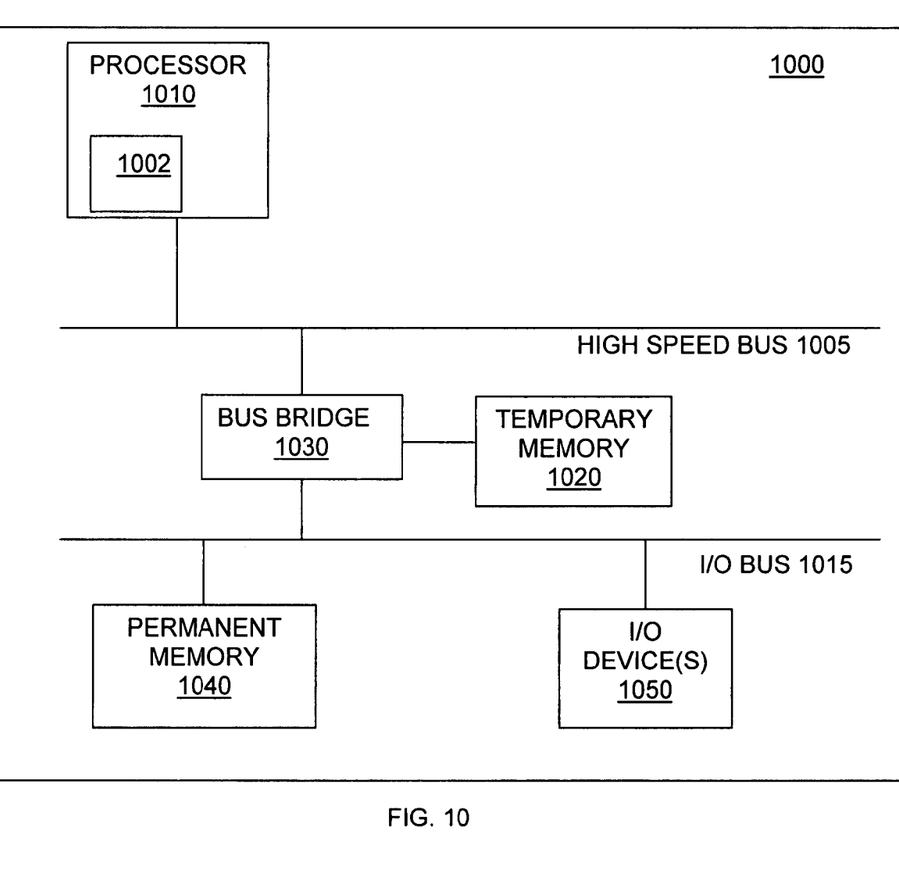
FIG. 10 illustrates is a block diagram of a computer system including a device with a DLL including a test circuit.

FIG. 10 illustrates is a block diagram of a computer system 1000 including a device with a DLL 1002 including an earlier described test circuit. As shown, the computer system 1000 includes a processor 1010 on high-speed bus 1005. DLL 1002, incorporated with the earlier described test circuit provides for improved testability of processor 1010. High-speed bus 1005 is connected through bus bridge 1030 to input/output (I/O) bus 1015. Bus bridge 1030 has coupled to it temporary memory 1020, such as SDRAM and DRAM I/O bus 1015 connects permanent memory 1040, such as flash devices and mass storage device (e.g. fixed disk device), and I/O devices 1050 to each other and bus bridge 1030.

In various embodiments, system 1000 may be a hand held computing device, a mobile phone, a digital camera, a tablet computer, a laptop computer, a desktop computer, a set-top box, a CD player, a DVD player, or a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. While the above circuits have been described with reference to particular logic levels, it is recognized that logic levels are arbitrary and the above circuits may be been described using different logic elements. For example, test elements were described as negative edge triggered flip-flops. It is to be recognized that other devices may be utilized without deviating from the scope of the embodiments presented herein. This application is intended to cover any adaptations or variations of the embodiments discussed herein. Therefore, it is manifestly intended that this invention be limited only by the claims and the equivalents thereof.

The invention claimed is:

1. An apparatus comprising:
  a delay lock loop circuit;
  a first input signal trace coupled to the delay lock loop circuit to provide a first input signal to the delay lock loop circuit;
  a first output signal trace coupled to the delay lock loop circuit to receive a first output signal from the delay lock loop circuit;
  first circuitry coupled to the first input signal trace, the first output signal trace and the delay lock loop circuit to generate a first test output signal on a first test output signal trace, the first test output signal indicative of a relationship between a first transition on the first input signal and a second transition on the first output signal;
  a second output signal trace coupled to the delay lock loop circuit to receive a second output signal from the delay lock loop circuit;
  second circuitry coupled to the first output signal trace, the second output signal trace and the delay lock loop circuit to generate a second test output signal on a second test output signal trace, the second test output signal indicative of a relationship between a third transition on the first output signal and a fourth transition on the second output signal; and
  wherein the first input signal trace and the first output signal trace are coupled to a first one or more delay cells of the delay lock loop circuit and the second output signal trace is coupled to a second one or more delay cells of the delay lock loop circuit.

2. The apparatus of claim 1 wherein the delay lock loop circuit comprises a programmable delay lock loop circuit.

3. The apparatus of claim 1 wherein the delay lock loop circuit comprises:
  a master circuit;
  a first slave circuit coupled to the master circuit, the first input signal trace and the first output signal trace, the first slave circuit including the first one or more delay cells; and
  a second slave circuit coupled to the master circuit, a second input signal trace and the second output signal trace, the second slave circuit including the second one or more delay cells.

4. The apparatus of claim 3 wherein the master circuit comprises:
  a bias circuit coupled to the delay cells.

5. The apparatus of claim 1 wherein the first circuitry comprises a sequential storage device.

6. The apparatus of claim 5 wherein the first input signal trace is coupled to a clock pin of the sequential storage device, the first output signal trace is coupled to a data input pin of the sequential storage device and the first test output signal trace is coupled to a data output pin of the sequential storage device.

7. The apparatus of claim 5 wherein the sequential storage device comprises a falling edge triggered D-type flip-flop.

8. A system comprising:
a semiconductor component including;
a delay lock loop circuit;
a first input signal trace coupled to the delay lock loop circuit to provide a first input signal to the delay lock loop circuit;
a first output signal trace coupled to the delay lock loop circuit to receive a first output signal from the delay lock loop circuit;
first circuitry coupled to the first input signal trace, the first output signal trace and the delay lock loop circuit to generate a first test output signal on a first test output signal trace, the first test output signal indicative of when the first input signal transitions relative to a transition on the first output signal trace;
a second output signal trace coupled to the delay lock loop circuit to receive a second output signal from the delay lock loop circuit;
second circuitry coupled to the first output signal trace, the second output signal trace and the delay lock loop circuit to generate a second test output signal on a second test output signal trace, the second test output signal indicative of a relationship between a third transition on the first output signal and a fourth transition on the second output signal;
wherein the first input signal trace and the first output signal trace are coupled to a first one or more delay cells of the delay lock loop circuit and the second output signal trace is coupled to a second one or more delay cells of the delay lock loop circuit
a mass storage device; and
at least one bus coupled between the semiconductor component and the mass storage device to facilitate data exchange between the semiconductor component and the mass storage device.

9. The system of claim 9, wherein the delay lock loop circuit comprises a programmable delay lock loop.

10. The system of claim 8 wherein the system is a system selected from a group consisting of a mobile phone, a digital camera, a set-top box, a CD player, and a DVD player.

11. The system of claim 8, wherein said delay lock loop circuit comprises:
a master circuit;
a first slave circuit coupled to the master circuit, the first input signal trace and the first output signal trace, the first slave circuit including the first one or more delay cells; and
a second slave circuit coupled to the master circuit, the second input signal trace and the second output signal trace, the second slave circuit including the second one or more delay cells.

* * * * *

UNITED STATES PATENT AND TRADEMARK OFFICE
CERTIFICATE OF CORRECTION

PATENT NO. : 7,061,224 B2  Page 1 of 1
APPLICATION NO. : 10/949583
DATED : June 13, 2006
INVENTOR(S) : Kakizawa et al.

It is certified that error appears in the above-identified patent and that said Letters Patent is hereby corrected as shown below:

Figure 7
[Ref nos.] 712 and 740 should be deleted.

Figure 9
[Ref nos.] 930, 940, 950, and 960 should be deleted.

Column 2
Line 55, "...strobe out 130..." should read --...output strobe 130...--.

Column 3
Line 3, "...falling edge transition 240..." should read --...falling edge 240...--.

Column 4
Lines 32 and 45, "...MasterTest 358..." should read --...MasterTest signal 358...--.

Column 8
Line 8, "...lock loop circuit" should read --...lock loop circuit;...--.
Line 14, "9. ...of claim 9, ..." should read --9. ...of claim 8, ...--.

Signed and Sealed this

Sixth Day of November, 2007

JON W. DUDAS
*Director of the United States Patent and Trademark Office*